US009076661B2

(12) United States Patent
Ma et al.

(10) Patent No.: US 9,076,661 B2
(45) Date of Patent: Jul. 7, 2015

(54) METHODS FOR MANGANESE NITRIDE INTEGRATION

(71) Applicant: Applied Materials, Inc., Santa Clara, CA (US)

(72) Inventors: Paul F. Ma, Santa Clara, CA (US); Jennifer Meng Tseng, Saratoga, CA (US); Mei Chang, Saratoga, CA (US); Annamalai Lakshmanan, Fremont, CA (US); Jing Tang, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 13/905,932

(22) Filed: May 30, 2013

(65) Prior Publication Data
US 2013/0292806 A1 Nov. 7, 2013

Related U.S. Application Data

(63) Continuation-in-part of application No. 13/860,681, filed on Apr. 11, 2013, now abandoned.

(60) Provisional application No. 61/623,972, filed on Apr. 13, 2012.

(51) Int. Cl.
*H01L 23/58* (2006.01)
*H01L 29/06* (2006.01)
(Continued)

(52) U.S. Cl.
CPC .......... *H01L 29/06* (2013.01); *H01L 21/02104* (2013.01); *H01L 21/28556* (2013.01); *H01L 21/28562* (2013.01); *H01L 23/53238* (2013.01); *H01L 21/76814* (2013.01); *H01L 21/76826* (2013.01); *H01L 21/76831* (2013.01); *H01L 21/76843* (2013.01); *H01L 21/76846* (2013.01);
(Continued)

(58) Field of Classification Search
USPC .......... 438/627, 622, 618, 643; 257/E21.579, 257/E21.495, E21.585, E21.627, E21.597, 257/E21.171, E21.584, E21.476
See application file for complete search history.

(56) References Cited

U.S. PATENT DOCUMENTS 6,821,563 B2 11/2004 Yudovsky
6,878,206 B2 4/2005 Tzu et al.
(Continued)

FOREIGN PATENT DOCUMENTS

KR 20060042167 5/2006
KR 10-2009-0010089 1/2009

OTHER PUBLICATIONS

Non-Final Office Action in U.S. Appl. No. 13/860,618, dated Feb. 27, 2014, 16 pgs.
(Continued)

*Primary Examiner* — Dao H Nguyen
*Assistant Examiner* — Tram H Nguyen
(74) *Attorney, Agent, or Firm* — Servilla Whitney LLC

(57) ABSTRACT

Described are methods of forming a semiconductor device. Certain methods comprises depositing a film comprising manganese nitride over a dielectric; depositing a copper seed layer over the film; and depositing a copper fill layer over the copper seed layer. Also described are semiconductor devices. Certain semiconductor devices comprise a low-k dielectric layer; a manganese nitride layer overlying the low-k dielectric layer; a seed layer selected from a copper seed layer or electrochemical deposition seed layer overlying the manganese nitride layer; a copper layer overlying the copper seed layer.

14 Claims, 3 Drawing Sheets

(51) Int. Cl.
*H01L 21/02* (2006.01)
*H01L 21/285* (2006.01)
*H01L 23/532* (2006.01)
*H01L 21/768* (2006.01)
*C23C 16/34* (2006.01)
*C23C 16/455* (2006.01)

(52) U.S. Cl.
CPC .... *H01L 21/76856* (2013.01); *H01L 21/76862* (2013.01); *H01L 21/76867* (2013.01); *C23C 16/34* (2013.01); *C23C 16/45525* (2013.01)

(56) References Cited

U.S. PATENT DOCUMENTS

| | | |
|---|---|---|
| 6,916,398 B2 | 7/2005 | Chen et al. |
| 7,253,097 B2 * | 8/2007 | Lim et al. .................... 438/627 |
| 7,780,785 B2 | 8/2010 | Chen et al. |
| 7,932,176 B2 | 4/2011 | Gordon et al. |
| 8,206,552 B2 | 6/2012 | Chen et al. |
| 8,569,165 B2 * | 10/2013 | Gordon et al. ............... 438/628 |
| 2002/0102838 A1 | 8/2002 | Paranjpe et al. |
| 2004/0121616 A1 | 6/2004 | Satta et al. |
| 2005/0218519 A1 | 10/2005 | Koike et al. |
| 2007/0020923 A1 | 1/2007 | Kraus et al. |
| 2008/0254232 A1 * | 10/2008 | Gordon et al. ............... 427/585 |
| 2009/0120787 A1 * | 5/2009 | Okamura et al. ........ 204/192.25 |
| 2009/0257927 A1 | 10/2009 | Ramaswamy et al. |
| 2010/0035428 A1 | 2/2010 | Nakao et al. |
| 2011/0049716 A1 * | 3/2011 | Yang et al. .................... 257/751 |
| 2011/0136339 A1 | 6/2011 | Gambino et al. |
| 2011/0163062 A1 | 7/2011 | Gordon et al. |
| 2012/0025380 A1 | 2/2012 | Koike et al. |
| 2012/0043023 A1 | 2/2012 | Ramaswamy et al. |
| 2013/0270702 A1 * | 10/2013 | Yu et al. ..................... 257/751 |

OTHER PUBLICATIONS

Baxter, David V. et al., "Molecular Routes to Metal Carbides, Nitrides, and Oxides. 2. Studies of the Ammonolysis of Metal Dialkylamides and Hexamethyldisilylamides", *Chem. Mater.* 8 1996, 1222-1228.

Clark, Parker, "Conformal Copper Seed Layers for Through-Silicon Vias Using Chemical Vapor Deposition", *NNIN REU Research Accomplishments* 2011, 2 pgs.

"International Search Report and Written Opinion in PCT/US2013/036407" mailed Jul. 26, 2013, 11 pages.

Au, Yenug et al., "Filling Narrow Trenches by Iodine-Catalyzed CVD of Copper and Manganese on Manganese Nitride Barrier/Adhesion Layers", *Journal of the Electrochemical Society*, vol. 158, (2011) pp. D248-D253.

Au, Yeung et al., "Selective Chemical Vapor Deposition of Manganese Self- Aligned Capping Layer for Cu Interconnections in Microelectronics", *Journal of the Electrochemical Society*, vol. 157 (2010) pp. D341-D345.

Non-Final Office Action in U.S. Appl. No. 13/860,618, dated Sep. 18, 2014, 17 pages.

PCT International Preliminary Report on Patentability in PCT/US2013/036407, mailed Oct. 23, 2014, 8 pages.

PCT International Search Report and Written Opinion in PCT/US2014/040239, mailed Oct. 27, 2014, 13 pages.

Spicer, Charles, Wayne, Synthesis Characterization and Chemical Vapor Deposition of Transition Metal di(tert-butyl)amido Compounds, Thesis Dissertation, Univ. of Illinois, 2008, 133 pages.

* cited by examiner

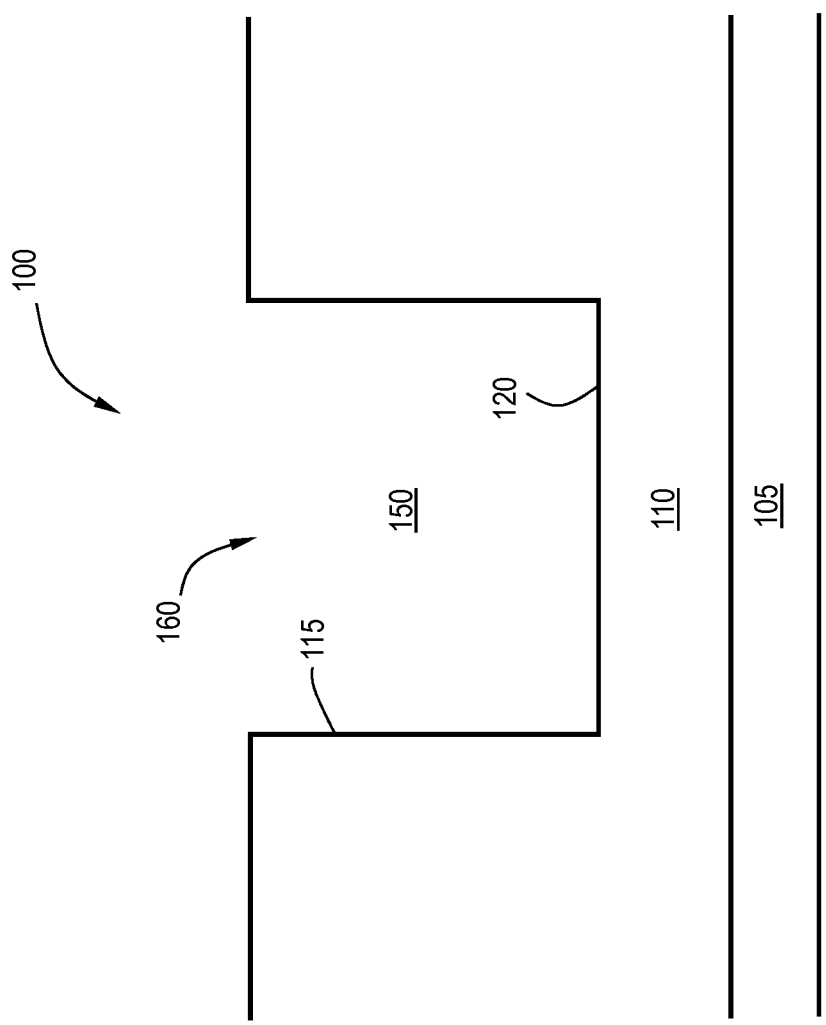

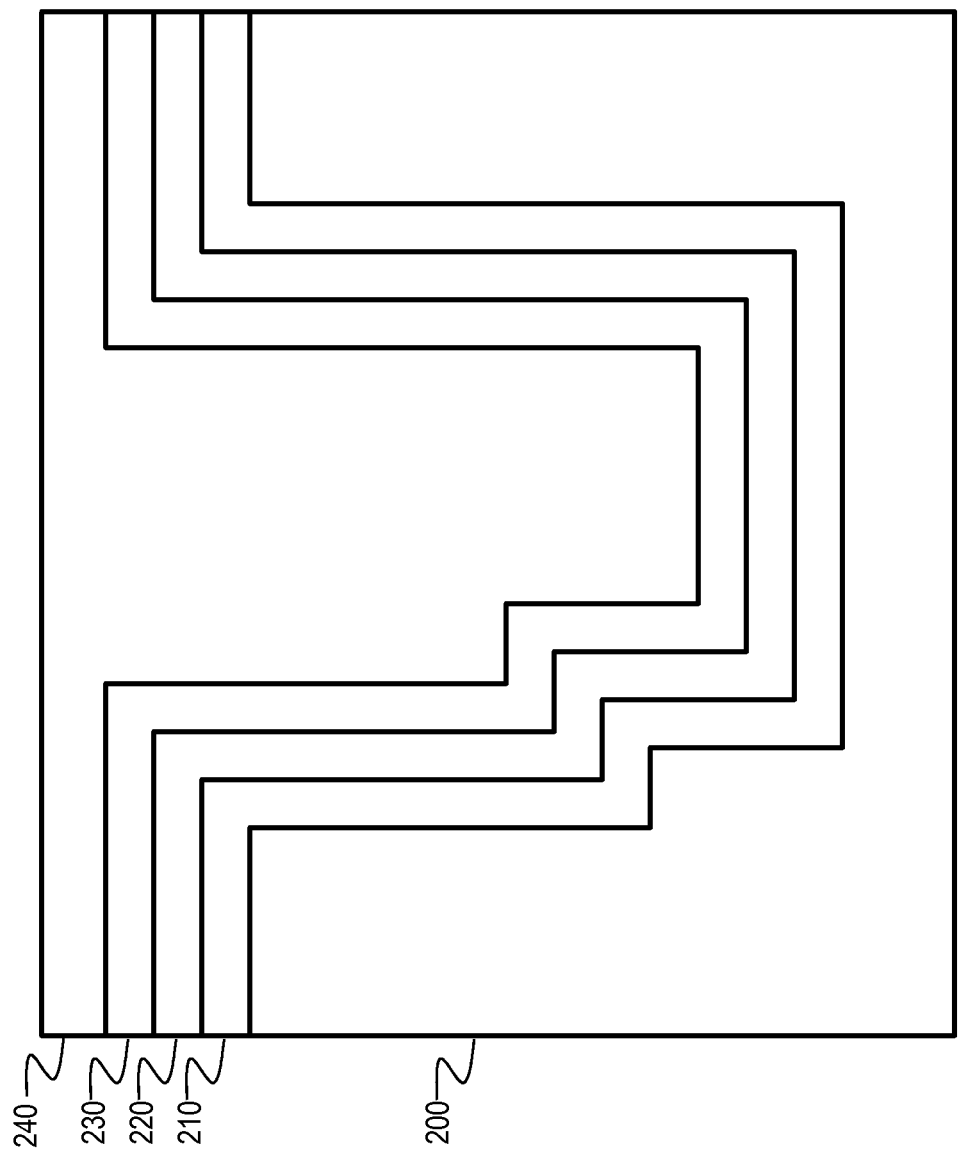

METHODS FOR MANGANESE NITRIDE INTEGRATION

CROSS-REFERENCE TO RELATED APPLICATIONS

This application is a continuation-in-part application of U.S. Non-Provisional application Ser. No. 13/860,618, filed Apr. 11, 2013, which claims priority to U.S. Provisional Application No. 61/623,972, filed Apr. 13, 2012.

FIELD

Embodiments of the present invention relate generally to barrier layers in semiconductor devices, and their integration into semiconductor devices. More particularly, embodiments of the invention relate to films comprising manganese nitride integration.

BACKGROUND

Microelectronic devices, such as semiconductors or integrated circuits, can include millions of electronic circuit devices such as transistors, capacitors, etc. To further increase the density of devices found on integrated circuits, even smaller feature sizes are desired. To achieve these smaller feature sizes, the size of conductive lines, vias, and interconnects, gates, etc. must be reduced. Reliable formation of multilevel interconnect structures is also necessary to increase circuit density and quality. Advances in fabrication techniques have enabled use of copper for conductive lines, interconnects, vias, and other structures. However, electromigration in interconnect structures becomes a greater hurdle to overcome, with decreased feature size and the increased use of copper for interconnections.

Tantalum nitride (TaN) is a copper barrier at film thicknesses greater than 10 A, where the film is continuous. However, because a Ta atom is about 4 A in diameter, TaN films around 5 A thick are not continuous. For smaller nodes where thinner TaN is required, TaN by itself may be a discontinuous film, thus limiting its copper barrier properties. Current methods include a Ta layer on top of a TaN layer, which acts as a wetting layer for copper and provides the continuity of a barrier film. For smaller nodes (less than 32 nm), however, this method leads to larger line resistance and hence is not an adequate solution.

Physical vapor deposited (PVD) tantalum nitride (TaN) is a standard material for diffusion bathers in copper interconnections. Due to poor adhesion of copper to the TaN, a tantalum liner is also used to enhance the durability of the interconnect structures. As the dimension of copper interconnections are being reduced to sub-20 nm, the non-conformal nature of PVD TaN barrier plus Ta liner has caused issues, such as copper gap fill voiding and high line resistance. Atomic layer deposition (ALD) TaN is being used as an advanced technology with better conformality; however, the film quality of ALD TaN still needs significant improvements.

Therefore, there is a need in the art for thin layers that are effective copper barriers.

SUMMARY

One aspect of the invention pertains to a method of forming a semiconductor device, the method comprising: depositing a film comprising manganese nitride over a dielectric; depositing a copper seed layer over the film; and depositing a copper fill layer over the copper seed layer. Various embodiments are listed below. It will be understood that the embodiments listed below may be combined not only as listed below, but in other suitable combinations in accordance with the scope of the invention.

In one or more embodiments, the dielectric is a low-k dielectric. In some embodiments, the method further comprises depositing a pore sealant over the dielectric prior to depositing the film comprising manganese nitride. In one or more embodiments, depositing a copper seed layer comprises chemical vapor deposition, atomic layer deposition, physical vapor deposition or electrochemical deposition. In some embodiments, the manganese nitride is deposited by atomic layer deposition. In one or more embodiments, the method further comprises treating the manganese nitride film with an ammonia plasma post treatment. In some embodiments, the manganese nitride and copper seed layer are deposited in the same chamber. In one or more embodiments, the manganese nitride has a formula of $Mn_3N_2$.

A second aspect of the invention pertains to a method of forming a semiconductor device, the method comprising: depositing a film comprising manganese nitride over a dielectric; depositing a film comprising cobalt or ruthenium over the film comprising manganese nitride or doping the manganese nitride layer with cobalt or ruthenium; depositing a copper seed layer; and depositing a copper fill layer over the copper seed layer.

In one or more embodiments, the dielectric is a low-k dielectric. In some embodiments, the method further comprises depositing a pore sealant over the low-k dielectric prior to depositing the film comprising manganese nitride. In one or more embodiments, depositing a copper seed layer comprises chemical vapor deposition, atomic layer deposition, physical vapor deposition or electrochemical deposition. In some embodiments, the manganese nitride is deposited by atomic layer deposition. In one or more embodiments, the method further comprises treating the manganese nitride film with a ammonia plasma post treatment. In some embodiments, the manganese nitride and copper seed layer are deposited in the same chamber. In one or more embodiments, depositing the manganese nitride and depositing the film comprising cobalt or ruthenium occurs without a vacuum break. In some embodiments, the manganese nitride has a formula of $Mn_3N_2$.

Yet another aspect of the invention pertains to a semiconductor device comprising: a low-k dielectric layer; a manganese nitride layer overlying the low-k dielectric layer; a seed layer selected from a copper seed layer or electrochemical deposition seed layer overlying the manganese nitride layer; a copper layer overlying the copper seed layer. In one or more embodiments, the semiconductor device further comprises a cobalt- or ruthenium-containing layer overlying the manganese nitride layer but under the seed layer. In some embodiments, the seed layer comprises a copper seed layer.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIGS. 1A and 1B illustrate a dielectric layer before and after deposition of a barrier layer and conductive fill material in accordance with one or more embodiments of the invention; and FIG. 2 illustrates a semiconductor device in accordance with one or more embodiments of the invention.

DETAILED DESCRIPTION

Figure 1B:
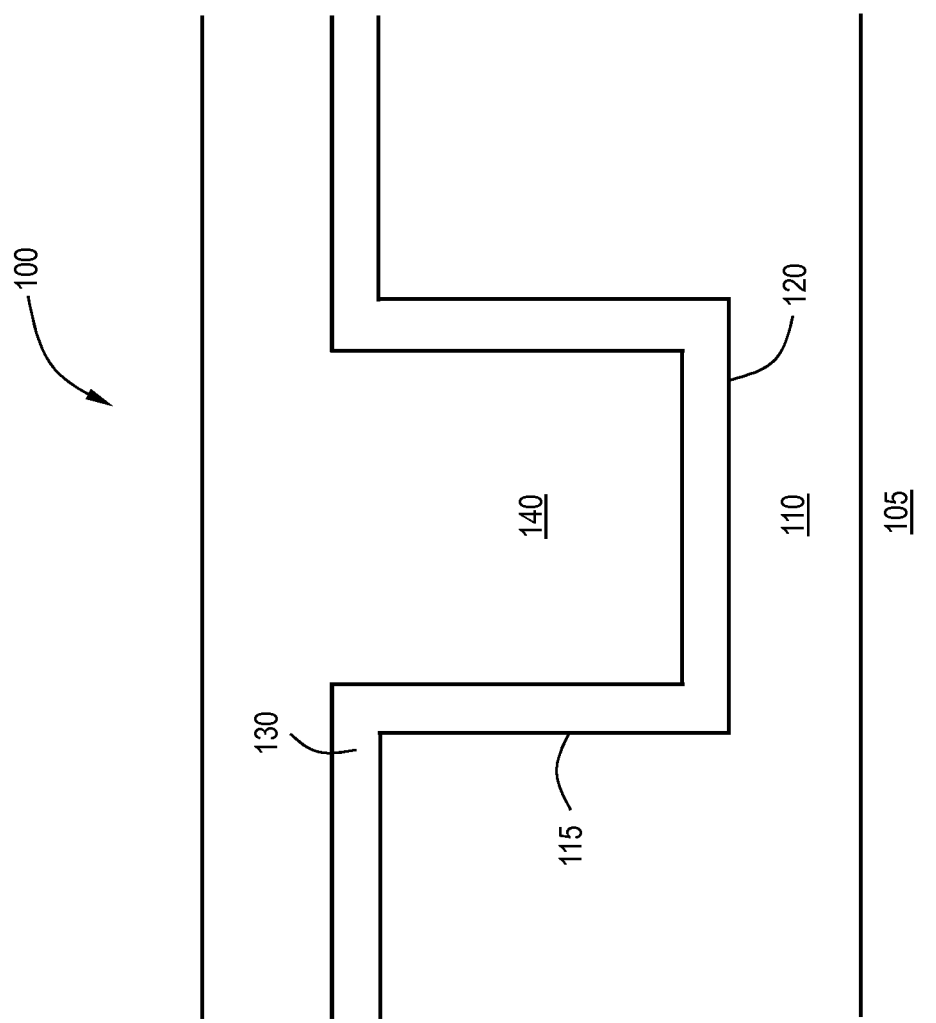

Before describing several exemplary embodiments of the invention, it is to be understood that the invention is not limited to the details of construction or process steps set forth in the following description. The invention is capable of other embodiments and of being practiced or being carried out in various ways.

Embodiments of the invention relate to the integration of films comprising manganese nitride for back end of the line interconnects. Such films may be useful as a copper bather and/or copper wetting material during the fabrication of semiconductor devices.

Accordingly, one aspect of the invention pertains to method of forming a semiconductor device, the method comprising: depositing a film comprising manganese nitride over a dielectric; depositing a copper seed layer over the film; and depositing a copper fill layer over the copper seed layer. Several variants of the above method will be described below.

Manganese nitride is deposited over a dielectric material. The dielectric layer may be provided using methods known in the art. The dielectric layer may overly other layers, as the situation calls for. In one or more embodiments, the dielectric may comprise a low-k dielectric. As used herein, "low-k dielectric" refers a dielectric material having a k value of less than about 4. Examples of low-k dielectrics include, but are not limited to, fluorinated silicate glass (FSG) (k=3.5), Black Diamond I (k=3.0), Black Diamond IIx (k=2.6), Black Diamond III (k=2.2) In some embodiments, the dielectric may be porous. In such embodiments, the method may further comprise depositing a pore sealant over the dielectric prior to depositing the film comprising manganese nitride.

In one or more embodiments, as used herein, "manganese nitride" may be referred to as "$MnN_x$." Deposition of a film comprising manganese nitride may be carried out by any suitable method. The deposition methods can be atomic layer deposition (ALD) or chemical vapor deposition (CVD). The amount of manganese to nitride may be expressed as a ratio. In one or more embodiments, the atomic ratio of Mn:N ranges from about 90:10 to about 20:80. Examples of suitable manganese nitride film phases include, but are not limited to $Mn_4N$, $Mn_3N_2$, $Mn_6N_5$. In further embodiments, the Mn:N ratio is about 60:40 and/or the phase is $Mn_3N_2$.

The manganese nitride layer may be formed by any appropriate deposition process. For example, the manganese layer can be deposited by an alternating layer deposition (ALD) process or a plasma enhanced atomic layer deposition (PEALD). The dopant can then be deposited by chemical vapor deposition (CVD), physical vapor deposition (PVD) or ALD. The dopant is then diffused into the manganese-containing layer to form an integrated manganese-containing dopant layer. The dopant may be diffused into the manganese-containing layer through various processes, including by plasma treatment and by heating.

In some embodiments, $MnN_x$ is deposited using an organometallic precursor. In some embodiments, it may be beneficial to avoid precursors having oxygen containing ligands, which leads to $MnO_x$ formation. Manganese oxides formed on copper surfaces may be difficult to segregate away and can increase the via resistance. Some precursors have extremely low vapor pressure and reaction rate, which poses challenges for chamber design and poor film morphology during ALD deposition. The precursor of some embodiments can generate a high purity manganese film by CVD and high purity $MnN_x$ films by ALD with smooth morphology.

The organometallic precursor may include a manganese silyl amido complex. ALD of $MnN_x$ from trimethyl silyl amido manganese complexes of some embodiments has been performed on standard ALD chambers.

In some embodiments, the substrate is exposed to a first precursor and a reactant. The exposure to these precursors can be substantially simultaneously, as in a CVD reaction, or sequentially, as in an ALD reaction. In a particular embodiment, the manganese nitride is deposited via ALD. As used in this specification and the appended claims, the term "substantially simultaneously" means that the precursor and reactant gases are flowed into the chamber to react with each other and the substrate surface together. It will be understood by those skilled in the art that there may be areas of the substrate which are briefly exposed to one of the precursor and reactant gas only until the other diffuses to the same area.

In some embodiments, the manganese-containing organometallic compound of the formula:

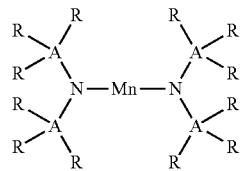

Each A is independently selected from carbon or silicon and each R is independently selected from hydrogen, methyl, substituted or un-substituted alkanes, branched or un-branched alkanes, substituted or un-substituted alkenes, branched or un-branched alkenes, substituted or un-substituted alkynes, branched or un-branched alkynes or substituted or un-substituted aromatics. The oxidation state of the manganese can be in any suitable oxidation state capable of reacting with the substrate or the reactant. In some embodiments, the manganese is Mn(II) or Mn(III).

The deposition of the manganese-containing film can be performed on a bare substrate surface or on a film already present on the substrate surface. For example, the manganese-containing film can be deposited on a dielectric film present on the surface. The dielectric film can have various structures (e.g., trenches) formed therein which have tops, bottoms and sidewalls. In some embodiments, there is a dielectric film with at least one trench having a sidewall and bottom. The bottom can be either the dielectric or a surface under the dielectric (e.g., bare substrate or another material). The deposition of the manganese-containing film can be selective for the difference surfaces. In some embodiments, the deposition of the manganese-containing film is selective for the dielectric layer or the underlying layer.

In some embodiments, each A is a nitrogen atom. In one or more embodiments, each R group is a methyl. In some embodiments, the manganese-containing organometallic compound comprises manganese bis[bis(trimethylsilyl) amide]. In some embodiments, the reactant is one or more of ammonia. Without being bound by any particular theory of operation, it is believed that the Mn—N bonds are broken during film formation. Therefore, as an example, if ammonia is used, a manganese nitride film can be formed.

In some embodiments, the dielectric may be porous and may require a pore sealant. An example of suitable methods include ALD of $SiO_2$ and exposure to an $N_2O$ plasma.

The copper seed layer may be deposited over the film comprising manganese nitride using methods known in the art. Such methods include, but are not limited to chemical vapor deposition (CVD), atomic layer deposition (ALD), physical vapor deposition (PVD) and/or electrochemical deposition (ECD).

Depending on the specific mode of deposition, it may be advantageous to carry out more than one of the process in the same chamber. In one or more embodiments, the manganese nitride and copper seed layer are deposited in the same chamber. In further embodiments, such chambers would contain at least two ampoules for the various chemicals needed during deposition. In alternative embodiments, the manganese nitride and copper seed layer are deposited in different chambers. In one or more embodiments, deposition of the manganese nitride and the film comprising cobalt or ruthenium occurs without a vacuum break.

Following deposition of the copper seed layer, a copper fill layer is deposited over the copper seed layer. This can be carried out via methods known in the art, including, but not limited to, chemical vapor deposition and physical vapor deposition.

In one or more embodiments, the methods described herein further comprise treating a manganese nitride film with an ammonia ($NH_3$) plasma post treatment. After deposition of the copper fill, the surface of the substrate may need to be polished. Post treatment with a plasma comprising ammonia helps to prevent degradation during chemical mechanical polishing techniques. During the $NH_3$ post treatment, the Mn:N ratio is modulated towards a nitrogen-rich ratio. Increase of the nitrogen content in the MnN helps to prevent CMP corrosion.

Suitable conditions for the ammonia plasma treatment may be selected for the particular films, precursors, etc. used. Suitable temperatures during exposure to the plasma will generally range from about 150° C. to about 300° C. Pressures will generally range from about 0.5 Torr to 10 Torr. Spacing will generally range form about 100 mils to about 500 mils. RF Power at 40 MHz will generally range from about 100 W to about 1000 W. The $NH_3$ flow rate generally will range from about 500 to about 5000 sccm. A noble gas plasma may also be used in the process. For example, argon may be flowed at a rate of about 500 to about 5,000 sccm.

In one or more embodiments, the methods described herein further comprise depositing a film comprising cobalt or ruthenium over the film comprising manganese nitride. This can be accomplished by methods known in the art.

Alternatively, the cobalt or ruthenium may not be a separate and distinct layer, but a dopant in the manganese nitride film. According to one or more embodiments of this aspect, the barrier layer comprises manganese nitride and a dopant selected from Mn, Co, Ru, Ta, Al, Mg, Cr, Nb, Ti and V. Alternatively, the manganese and the dopant can be deposited in alternating layers. In accordance with this embodiment, a first manganese-containing layer, such as a manganese monolayer, is deposited on a dielectric film. While a dielectric film is described as the underlying layer for deposition of the manganese-containing film, it will be understood that the underlying layer can be any suitable layer including, but not limited to, a metal layer or a base substrate. A first dopant layer, such as a layer of dopant, dopant alloy or other dopant-containing compound, may then be deposited on top of the first manganese-containing layer. This first dopant layer can also be a monolayer. A second manganese-containing layer is then deposited on top of the first dopant layer. This process is repeated until a doped manganese-containing film of the desired thickness is produced. The ratio of manganese-containing layers to dopant layers can be any suitable combination and is not limited to 1:1. For example, there can be ten manganese-containing layers deposited for every one dopant layer.

In some embodiments, there are more than one precursors gases flowed into the processing chamber, either simultaneously or separately. For example, a manganese-containing precursor and a cobalt precursor can be flowed into the chamber together to react with the surface. The reactant employed can be specific for one of the precursor species or common to both species. In some embodiments, the substrate or surface is exposed to a first precursor followed by a first reactant and to a second precursor different from the first precursor followed by either the first reactant or by a second reactant different from the first reactant.

For depositing the dopant metal, an appropriate metal-containing precursor may be used. Examples of suitable precursors include metal complexes containing the desired dopant, such as dopant metals coordinated with organic or carbonyl ligands. A suitable dopant precursor should have sufficient vapor pressure to be deposited in the appropriate process, such as ALD, CVD and PVD. Depending on the dopant precursor used, a co-reactant may be used to deposit the dopant. For example, reducing gases such as hydrogen and ammonia can be used as co-reactants for depositing some dopants.

Some embodiments of the invention provide that the doped manganese-containing film is treated with a plasma prior to depositing the conductive material. According to one or more embodiments, the plasma comprises one or more of He, Ar, $NH_3$, $H_2$ and $N_2$. The conductive material may be deposited in a variety of ways, including by an electroless deposition process, an electroplating (ECP) process, a CVD process or a PVD process. In some embodiments, a first seed layer is deposited upon the barrier layer, and a bulk conductive layer is then formed upon the seed layer.

In one or more embodiments, the bather layer comprises 0.1 to 10% dopant, based on the weight of the manganese layer. In some embodiments, the barrier layer comprises 0.2 to 8 wt. % dopant. In particular embodiments, the barrier layer comprises 0.5 to 5 wt. % dopant.

Another aspect of the invention pertains to the semiconductor devices produced by one or more of the methods described herein. The device will depend on how the method employed. For example, where the method comprises depositing a film comprising manganese nitride over a dielectric; depositing a copper seed layer over the film; and depositing a copper fill layer over the copper seed layer, the semiconductor device will comprise a copper fill layer over a copper seed layer over a film comprising manganese nitride layer overlaying a dielectric.

In one embodiment, the semiconductor device comprises a low-k dielectric layer; a manganese nitride layer overlying the low-k dielectric layer; a seed layer selected from a copper seed layer or electrochemical deposition seed layer overlying the manganese nitride layer; and a copper layer overlying the copper seed layer. In embodiments where the method comprises depositing a cobalt- or ruthenium-containing layer, the semiconductor device will further comprise a cobalt- or ruthenium-containing layer overlying the manganese nitride layer but under the seed layer. In embodiments where the method comprises depositing a seed layer, the semiconductor device will further comprise a copper seed layer. In further embodiments, the seed layer comprises an electrochemical deposition seed layer. In one or more embodiments, the semiconductor device further comprises a pore sealant overlying the low-k dielectric layer but under the manganese nitride layer.

There are many combinations of the various process that can be utilized. For example the method may comprise manganese nitride deposition, followed by ammonia post treatment, copper seed deposition, followed by conventional copper plating. In one or more other embodiments, the method may comprise deposition of manganese nitride, cobalt or ruthenium deposition or doping, followed by electrochemical seed deposition, followed by electrochemical plating. In some embodiments, the method comprises manganese nitride deposition, followed by deposition or doping of cobalt or ruthenium, followed by copper seed and electrochemical plating. In one or more embodiments, the method may comprise manganese nitride deposition, followed by cobalt or ruthenium deposition or doping, followed by copper seed and electrochemical chemical deposition seed, and then electrochemical plating. Any of the above could be preceded by pore sealing of a porous dielectric. Certain parts of the method (e.g., electrochemical plating and electrochemical deposition) may take place after vacuum break.

FIG. 1A depicts an embodiment of a microelectronic device 100 comprising a substrate 105 and a dielectric layer 110. The dielectric layer 110 is disposed upon the substrate 105, and the dielectric layer 110 has a trench 150 defined by a trench bottom 120, sidewalls 115, and opening 160.

In one or more embodiments, the dielectric layer 110 is a low-k dielectric layer. In some embodiments, the dielectric layer comprises $SiO_x$. Further embodiments provide that the dielectric layer comprises porous carbon-doped $SiO_x$. In one or more embodiments, the dielectric layer is a porous carbon-doped $SiO_x$ layer with a k value less than 3.

FIG. 1B shows the same microelectronic device 100 after deposition of a barrier layer 130, which covers at least a portion of the sidewall 115 and/or trench bottom 120. As shown in FIG. 1B, the barrier layer 130 may cover the entirety of the sidewall 115 and trench bottom 120. The bather layer 130 may comprise $MnN_x$ and one or more dopants such as Co, Mn, Ru, Ta, Al, Mg, Cr, Nb, Ti or V.

In one or more embodiments, the bather layer comprises 0.1 to 10% dopant, based on the weight of the manganese layer. In some embodiments, the barrier layer comprises 0.2 to 8 wt. % dopant. In particular embodiments, the barrier layer comprises 0.5 to 5 wt. % dopant.

According to one or more embodiments, as used herein, "barrier layer" refers to a discrete layer formed by depositing TaN and one or more dopants, and excludes a region in which a second element or dopant diffuses into only a portion of the bather layer. In other words, the dopant is present throughout the entire thickness of the TaN layer, and not only at a surface portion thereof.

A conductive fill material 140 fills at least a portion of the trench 150 lined with barrier layer 130. According to one or more embodiments, the conductive fill material comprises copper or a copper alloy. In other embodiments, the conductive fill material further comprises Al.

Although the conductive fill material 140 in FIG. 1B is shown in direct contact with the barrier layer 130, intermediate layers may be in between the conductive fill material 140 and the barrier layer 130, such as adhesion layers or seeding layers. According to one or more embodiments, the microelectronic device further comprises an adhesion layer comprising one or more of Ru and Co, Mn. In addition to Ru and/or Co, the adhesion layer may comprise one or more dopants such as Ta, Al, Mg, Cr, Nb, Ti or V. In a particular embodiment, the adhesion layer comprises Ru and Mn. In addition to traditional liners, manganese and manganese nitride can be used as liners. For example, when PVD Cu is replaced by CVD Cu, manganese nitride may be a promising liner. Also, manganese nitride can be reduced to Mn to act as a liner to promote the adhesion with Cu.

In some embodiments, a seeding layer is deposited on top of the barrier layer. According to one or more embodiments, the seeding layer comprises an alloy of copper, such as a Cu—Mn alloy. In some embodiments, the seeding layer comprises less than about 5 wt. % Mn, less than about 4 wt. % Mn, less than about 3 wt. % Mn, or less than about 2 wt. % Mn. In one or more embodiments, the seeding layer comprises about 1 wt. % Mn. The line resistance of copper alloys containing 1 wt. % Mn is expected to be the same as or similar to the line resistance of pure copper.

While not wishing to be bound to any particular theory, it is thought that the dopant can selectively diffuse through the barrier layer 130 to the dielectric layer 110 and form a complex with the dielectric material that will be resistant to electromigration. Thus, in some embodiments, the Mn can diffuse through the barrier layer and form $MnSiO_x$. This self-forming barrier layer of $MnSiO_x$ can then prevent copper electromigration from the conductive material 140 to the dielectric layer 110.

In addition to being a copper barrier, doped manganese may also be a barrier to oxygen diffusing from the dielectric layer 110 to the conductive material 140. Oxygen diffusion from the dielectric layer 110 to the conductive material 140 can result in oxygen reacting with components in the conductive material and/or seed layer. For example, oxygen can react with the layer at the interface of the barrier layer 130 and the conductive material 140, thus "pinning" the Mn to the barrier layer/conductive material interface. Similarly, if a seed layer comprising Mn is present, then oxygen can react with the Mn in the seed layer at the seed layer/barrier layer interface and pin the Mn to the interface.

FIG. 2 is another illustration that shows a device according to one or more embodiments of the invention. FIG. 2 shows low-k dielectric 200, which has several features (i.e., Damascene patterning). As mentioned above, such low-k dielectrics may be porous. As a result, deposited over low-k dielectric 200 can be pore sealant 210. Overlying pore sealant 210 is manganese nitride film 220. This manganese nitride film 220 can be any of the ones described herein. A copper seed layer 230 may be deposited over manganese nitride film 220. Following this, copper fill 240 may be deposited, for example, via a chemical vapor deposition process.

The methods described herein may, in one or more embodiments, be followed with chemical mechanical polishing of the deposited copper. The deposited manganese or MnN film can be used as an alternative diffusion barrier in the back-end-of-line copper interconnections to replace currently used PVD TaN or ALD TaN. The deposition approach can be integrated with the ALD TaN deposition to generate manganese doped TaN or tantalum doped with $MnN_x$. In alternative embodiments, TaN and MnN layers can be combined.

The films in accordance with various embodiments of this invention can be deposited over virtually any substrate material. A "substrate surface," as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, silicon nitride, doped silicon, germanium, gallium arsenide, glass, sapphire, and any other materials such as metals, metal nitrides, metal alloys, and other conductive materials, depending on the application. Barrier layers, metals or metal nitrides on a substrate surface include titanium, titanium nitride, tungsten nitride, tantalum and tantalum nitride, aluminum, copper, or any other conductor or conductive or non-conductive barrier layer useful for device fabrication. Substrates may have various dimensions, such as 200 mm or 300 mm diameter wafers, as well as, rectangular or square panes. Substrates on which embodiments of the invention may be useful include, but are not limited to semiconductor wafers, such as crystalline silicon (e.g., Si<100> or Si<111>), silicon oxide, strained silicon, silicon germanium, doped or undoped polysilicon, doped or undoped silicon wafers, III-V materials such as GaAs, GaN, InP, etc. and patterned or non-patterned wafers. Substrates may be exposed to a pretreatment process to polish, etch, reduce, oxidize, hydroxylate, anneal and/or bake the substrate surface.

As embodiments of the invention provide a method for depositing or forming doped manganese-containing films, a processing chamber is configured to expose the substrate to a sequence of gases and/or plasmas during the vapor deposition process. The processing chamber would include separate supplies of reactants, along with any supply of carrier, purge and inert gases such as argon and nitrogen in fluid communication with gas inlets for each of the reactants and gases. Each inlet may be controlled by an appropriate flow controller such as a mass flow controller or volume flow controller in communication with a central processing unit (CPU) that allows flow of each of the reactants to the substrate to perform a deposition process as described herein. The central processing unit may be one of any forms of a computer processor that can be used in an industrial setting for controlling various chambers and sub-processors. The CPU can be coupled to a memory and may be one or more of readily available memory such as random access memory (RAM), read only memory (ROM), flash memory, compact disc, floppy disk, hard disk, or any other form of local or remote digital storage. Support circuits can be coupled to the CPU to support the CPU in a conventional manner. These circuits include cache, power supplies, clock circuits, input/output circuitry, subsystems, and the like.

In atomic layer deposition type chambers, the substrate can be exposed to the first precursors and reactant either spatially or temporally separated processes. Temporal ALD, also referred to as time-domain ALD, is a traditional process in which the first precursor flows into the chamber to react (e.g., chemisorption) with the surface. The first precursor is purged from the chamber before flowing the reactant into the chamber. In spatial ALD, both the first precursor and reactant gases are simultaneously flowed to the chamber but are separated spatially so that there is a region between the flows that prevents mixing of the precursors. Often, there is a gas curtain (e.g., purge gases, vacuum ports or combinations thereof) between the first precursor and reactant to ensure separation. In spatial ALD, the substrate must be moved relative to the gas distribution plate, or vice-versa, so that each part of a substrate is exposed to both the first precursor and the reactant gases.

The substrate can be processed in single substrate deposition chambers, where a single substrate is loaded, processed and unloaded before another substrate is processed. The substrate can also be processed in a continuous manner, like a conveyer system, in which multiple substrate are individually loaded into a first part of the chamber, move through the chamber and are unloaded from a second part of the chamber. The shape of the chamber and associated conveyer system can form a straight path or curved path. Additionally, the processing chamber may be a carousel in which multiple substrates are moved about a central axis and exposed to the deposition gases at different positions.

The co-reactants are typically in vapor or gas form. The reactants may be delivered with a carrier gas. A carrier gas, a purge gas, a deposition gas, or other process gas may contain nitrogen, hydrogen, argon, neon, helium, or combinations thereof. The various plasmas described herein, such as the nitrogen plasma or the inert gas plasma, may be ignited from and/or contain a plasma co-reactant gas.

In one or more embodiments, the various gases for the process may be pulsed into an inlet, through a gas channel, from various holes or outlets, and into a central channel. In one or more embodiments, the deposition gases may be sequentially pulsed to and through a showerhead. Alternatively, as described above, the gases can flow simultaneously through gas supply nozzle or head and the substrate and/or the gas supply head can be moved so that the substrate is sequentially exposed to the gases.

Another aspect of the invention pertains to an apparatus for deposition of a film on a substrate to perform a process according to any of the embodiments described above. In one embodiment, the apparatus comprises a deposition chamber for deposition of a film on a substrate. The chamber comprises a process area for supporting a substrate. The apparatus includes a precursor inlet in fluid communication with a supply of a manganese precursor, such as manganese [bis(bis(trimethylsilyl)amide]. The apparatus also includes a reactant gas inlet in fluid communication with a supply of nitrogen-containing precursor, such as ammonia. The apparatus also includes a reactant gas inlet in fluid communication with a supply of dopant precursor, such as a dopant-containing metal complex. The apparatus further includes a purge gas inlet in fluid communication with a purge gas. The apparatus can further include a vacuum port for removing gas from the deposition chamber. The apparatus can further include an auxiliary gas inlet for supplying one or more auxiliary gases such as inert gases to the deposition chamber. The deposition can further include a means for heating the substrate by radiant and/or resistive heat.

In some embodiments, a plasma system and processing chambers or systems which may be used during methods described here for depositing or forming the films can be performed on either PRODUCER®, CENTURA®, or ENDURA® systems, all available from Applied Materials, Inc., located in Santa Clara, Calif. A detailed description of an ALD processing chamber may be found in commonly assigned U.S. Pat. Nos. 6,821,563, 6,878,206, 6,916,398, and 7,780,785.

In some embodiments, one or more layers may be formed during a plasma enhanced atomic layer deposition (PEALD) process. In some processes, the use of plasma provides sufficient energy to promote a species into the excited state where surface reactions become favorable and likely. Introducing the plasma into the process can be continuous or pulsed. In some embodiments, sequential pulses of precursors (or reactive gases) and plasma are used to process a layer. In some embodiments, the reagents may be ionized either locally (i.e., within the processing area) or remotely (i.e., outside the processing area). In some embodiments, remote ionization can occur upstream of the deposition chamber such that ions or other energetic or light emitting species are not in direct contact with the depositing film. In some PEALD processes, the plasma is generated external from the processing chamber, such as by a remote plasma generator system. The plasma may be generated via any suitable plasma generation process or technique known to those skilled in the art. For example, plasma may be generated by one or more of a microwave (MW) frequency generator or a radio frequency (RF) generator. The frequency of the plasma may be tuned depending on the specific reactive species being used. Suitable frequencies include, but are not limited to, 2 MHz, 13.56 MHz, 40 MHz, 60 MHz and 100 MHz. Although plasmas may be used during the deposition processes disclosed herein, it should be noted that plasmas may not be required. Indeed, other embodiments relate to deposition processes under very mild conditions without a plasma.

According to one or more embodiments, the substrate is subjected to processing prior to and/or after forming the layer. This processing can be performed in the same chamber or in one or more separate processing chambers. In some embodiments, the substrate is moved from the first chamber to a separate, second chamber for further processing. The substrate can be moved directly from the first chamber to the separate processing chamber, or it can be moved from the first chamber to one or more transfer chambers, and then moved to the desired separate processing chamber. Accordingly, the processing apparatus may comprise multiple chambers in communication with a transfer station. An apparatus of this sort may be referred to as a "cluster tool" or "clustered system", and the like.

Generally, a cluster tool is a modular system comprising multiple chambers which perform various functions including substrate center-finding and orientation, degassing, annealing, deposition and/or etching. According to one or more embodiments, a cluster tool includes at least a first chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. Two well-known cluster tools which may be adapted for the present invention are the Centura® and the Endura®, both available from Applied Materials, Inc., of Santa Clara, Calif. The details of one such staged-vacuum substrate processing apparatus is disclosed in U.S. Pat. No. 5,186,718, entitled "Staged-Vacuum Wafer Processing Apparatus and Method," Tepman et al., issued on Feb. 16, 1993. However, the exact arrangement and combination of chambers may be altered for purposes of performing specific steps of a process as described herein. Other processing chambers which may be used include, but are not limited to, cyclical layer deposition (CLD), atomic layer deposition (ALD), chemical vapor deposition (CVD), physical vapor deposition (PVD), etch, preclean, chemical clean, thermal treatment such as RTP, plasma nitridation, degas, orientation, hydroxylation and other substrate processes. By carrying out processes in a chamber on a cluster tool, surface contamination of the substrate with atmospheric impurities can be avoided without oxidation prior to depositing a subsequent film.

According to one or more embodiments, the substrate is continuously under vacuum or "load lock" conditions, and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants after forming the layer on the surface of the substrate. According to one or more embodiments, a purge gas is injected at the exit of the deposition chamber to prevent reactants from moving from the deposition chamber to the transfer chamber and/or additional processing chamber. Thus, the flow of inert gas forms a curtain at the exit of the chamber.

The substrate can be processed in single substrate deposition chambers, where a single substrate is loaded, processed and unloaded before another substrate is processed. The substrate can also be processed in a continuous manner, like a conveyer system, in which multiple substrate are individually loaded into a first part of the chamber, move through the chamber and are unloaded from a second part of the chamber. The shape of the chamber and associated conveyer system can form a straight path or curved path. Additionally, the processing chamber may be a carousel in which multiple substrates are moved about a central axis and are exposed to deposition, etch, annealing, cleaning, etc. processes throughout the carousel path.

During processing, the substrate can be heated or cooled. Such heating or cooling can be accomplished by any suitable means including, but not limited to, changing the temperature of the substrate support and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated continuously or in discreet steps. For example, a substrate may be rotated throughout the entire process, or the substrate can be rotated by a small amount between exposure to different reactive or purge gases. Rotating the substrate during processing (either continuously or in steps) may help produce a more uniform deposition or etch by minimizing the effect of, for example, local variability in gas flow geometries.

In atomic layer deposition type chambers, the substrate can be exposed to the first and second precursors either spatially or temporally separated processes. Temporal ALD is a traditional process in which the first precursor flows into the chamber to react with the surface. The first precursor is purged from the chamber before flowing the second precursor. In spatial ALD, both the first and second precursors are simultaneously flowed to the chamber but are separated spatially so that there is a region between the flows that prevents mixing of the precursors. In spatial ALD, the substrate must be moved relative to the gas distribution plate, or vice-versa.

Reference throughout this specification to "one embodiment," "certain embodiments," "one or more embodiments" or "an embodiment" means that a particular feature, structure, material, or characteristic described in connection with the embodiment is included in at least one embodiment of the invention. Thus, the appearances of the phrases such as "in one or more embodiments," "in certain embodiments," "in one embodiment" or "in an embodiment" in various places throughout this specification are not necessarily referring to the same embodiment of the invention. Furthermore, the particular features, structures, materials, or characteristics may be combined in any suitable manner in one or more embodiments.

Although the invention herein has been described with reference to particular embodiments, it is to be understood that these embodiments are merely illustrative of the principles and applications of the present invention. It will be apparent to those skilled in the art that various modifications and variations can be made to the method and apparatus of the present invention without departing from the spirit and scope of the invention. Thus, it is intended that the present invention include modifications and variations that are within the scope of the appended claims and their equivalents.

What is claimed is:

1. A method of forming a semiconductor device, the method comprising:
   depositing a film comprising manganese nitride over a dielectric by atomic layer deposition;
   treating the manganese nitride film with an ammonia plasma post treatment;
   depositing a copper seed layer over the film; and
   depositing a copper fill layer over the copper seed layer.

2. The method of claim 1, wherein the dielectric is a low-k dielectric.

3. The method of claim 1, further comprising depositing a pore sealant over the dielectric prior to depositing the film comprising manganese nitride.

4. The method of claim 1, wherein depositing a copper seed layer comprises chemical vapor deposition, atomic layer deposition, physical vapor deposition or electrochemical deposition.

5. The method of claim 1, wherein the manganese nitride and copper seed layer are deposited in the same chamber.

6. The method of claim 1, wherein the manganese nitride has a formula of $Mn_3N_2$.

7. A method of forming a semiconductor device, the method comprising:
   depositing a film comprising manganese nitride over a dielectric;
   treating the manganese nitride film with an ammonia plasma post treatment;
   depositing a film comprising cobalt or ruthenium over the film comprising manganese nitride or doping the manganese nitride layer with cobalt or ruthenium;
   depositing a copper seed layer; and
   depositing a copper fill layer over the copper seed layer.

8. The method of claim 7, wherein the dielectric is a low-k dielectric.

9. The method of claim 8, further comprising depositing a pore sealant over the low-k dielectric prior to depositing the film comprising manganese nitride.

10. The method of claim 8, wherein depositing a copper seed layer comprises chemical vapor deposition, atomic layer deposition, physical vapor deposition or electrochemical deposition.

11. The method of claim 8, wherein the manganese nitride is deposited by atomic layer deposition.

12. The method of claim 8, wherein the manganese nitride and copper seed layer are deposited in the same chamber.

13. The method of claim 8, wherein depositing the manganese nitride and depositing the film comprising cobalt or ruthenium occurs without a vacuum break.

14. The method of claim 8, wherein the manganese nitride has a formula of $Mn_3N_2$.

* * * * *